United States Patent
Tsai et al.

(10) Patent No.: US 9,947,540 B2
(45) Date of Patent: Apr. 17, 2018

(54) PRE-DEPOSITION TREATMENT AND ATOMIC LAYER DEPOSITION (ALD) PROCESS AND STRUCTURES FORMED THEREBY

(71) Applicant: Taiwan Semiconductor Manufacturing Company, Ltd., Hsin-Chu (TW)

(72) Inventors: Cheng-Yen Tsai, Hsin-Chu (TW); Da-Yuan Lee, Jhubei (TW); JoJo Lee, Hsin-Chu (TW); Ming-Hsing Tsai, Chu-Pei (TW); Hsueh Wen Tsau, Zhunan Township (TW); Weng Chang, Hsin-Chu (TW); Ying-Chieh Hung, Hsin-Chu (TW); Yi-Hung Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 143 days.

(21) Appl. No.: 14/815,286

(22) Filed: Jul. 31, 2015

(65) Prior Publication Data

US 2017/0032972 A1    Feb. 2, 2017

(51) Int. Cl.
| H01L 21/285 | (2006.01) |
| H01L 21/28 | (2006.01) |
| H01L 21/321 | (2006.01) |
| C23C 16/02 | (2006.01) |
| C23C 16/455 | (2006.01) |
| H01L 21/768 | (2006.01) |

(52) U.S. Cl.
CPC ........ *H01L 21/28088* (2013.01); *C23C 16/02* (2013.01); *C23C 16/0272* (2013.01); *C23C 16/45525* (2013.01); *H01L 21/321* (2013.01); *H01L 21/28562* (2013.01); *H01L 21/76843* (2013.01); *H01L 21/76856* (2013.01)

(58) Field of Classification Search
CPC ......... H01L 21/28562; H01L 21/76843; H01L 21/6856
See application file for complete search history.

(56) References Cited

U.S. PATENT DOCUMENTS

| 2002/0068466 A1 | 6/2002 | Lee et al. |
| 2003/0190424 A1 | 10/2003 | Sneh |

(Continued)

FOREIGN PATENT DOCUMENTS

| KR | 100385947 B1 | 6/2003 |
| KR | 20150008680 A | 1/2015 |
| TW | 201349311 A | 12/2013 |

*Primary Examiner* — Michael Carter
(74) *Attorney, Agent, or Firm* — Slater Matsil, LLP

(57) ABSTRACT

Various methods and structures formed by those methods are described. In accordance with a method, a first metal-containing layer is formed on a substrate. A second metal-containing layer is formed on the substrate. A material of the first metal-containing layer is different from a material of the second metal-containing layer. A chlorine-based treatment is performed on the first metal-containing layer and the second metal-containing layer. A third metal-containing layer is deposited on the first metal-containing layer and the second metal-containing layer using Atomic Layer Deposition (ALD).

20 Claims, 18 Drawing Sheets

(56) References Cited

U.S. PATENT DOCUMENTS

| | | | |
|---|---|---|---|
| 2004/0198025 A1* | 10/2004 | Derderian | C23C 16/06 |
| | | | 438/476 |
| 2013/0320410 A1 | 12/2013 | Lin et al. | |
| 2014/0131809 A1 | 5/2014 | Ando et al. | |
| 2015/0014780 A1* | 1/2015 | Kim | H01L 27/0924 |
| | | | 257/369 |

* cited by examiner

PRE-DEPOSITION TREATMENT AND ATOMIC LAYER DEPOSITION (ALD) PROCESS AND STRUCTURES FORMED THEREBY

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is used often in semiconductor devices. There may be a large number of transistors (e.g. hundreds of, thousands of, or millions of transistors) on a single integrated circuit (IC), for example. A common type of transistor used in semiconductor device fabrication is a metal oxide semiconductor field effect transistor (MOSFET), as an example. A planar transistor (e.g. planar MOSFET) typically includes a gate dielectric disposed over a channel region in a substrate, and a gate electrode formed over the gate dielectric. A source region and a drain region of the transistor are formed on either side of the channel region.

Multiple gate field-effect transistors (MuGFETs) are a recent development in semiconductor technology. One type of MuGFET is referred to as a FinFET, which is a transistor structure that includes a fin-shaped semiconductor material that is raised vertically out of the semiconductor surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
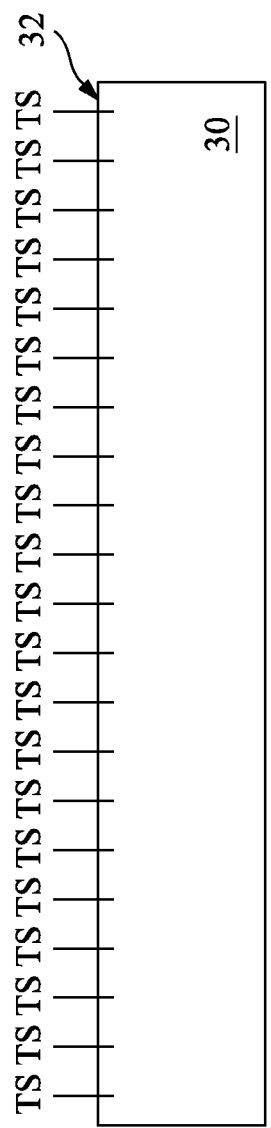
FIGS. 1A through 1C are cross-sectional views of intermediate stages in the manufacturing of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of, and structures formed by, depositing a layer using Atomic Layer Deposition (ALD) are provided in accordance with various embodiments. Some example methods to form Fin Field-Effect Transistors (finFETs), and the structures formed thereby, by using ALD are provided in accordance with various embodiments. Intermediate stages of forming generic structures and, further, example finFETs are illustrated. Some embodiments discussed herein are discussed in the context of finFETs formed using a gate-last process. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Figure 1B:
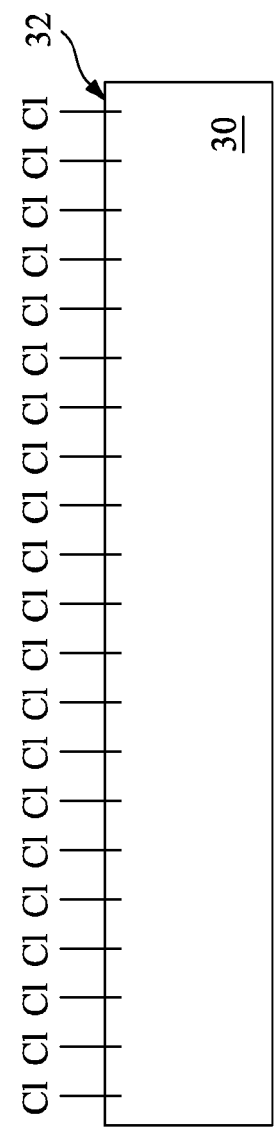
Figure 1C:
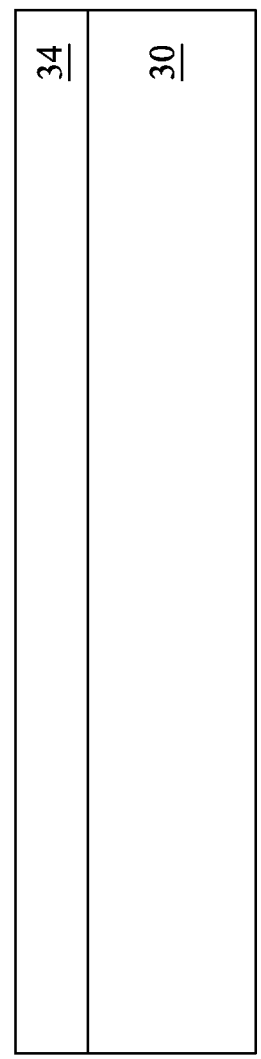
Figure 2:
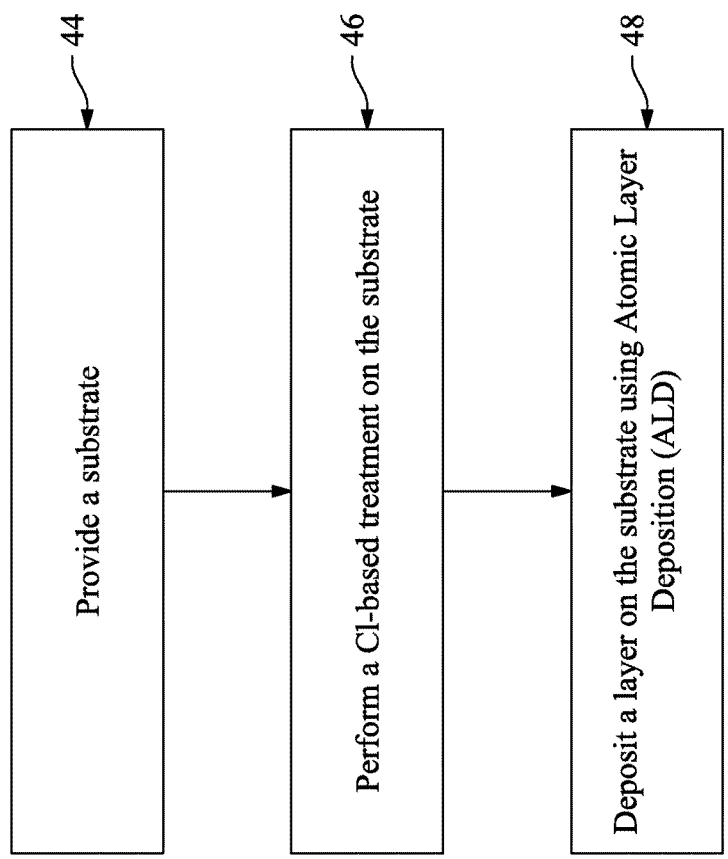
FIG. 2 is a flow chart of the manufacturing of the semiconductor structure of FIGS. 1A through 1C in accordance with some embodiments.
Figure 3:
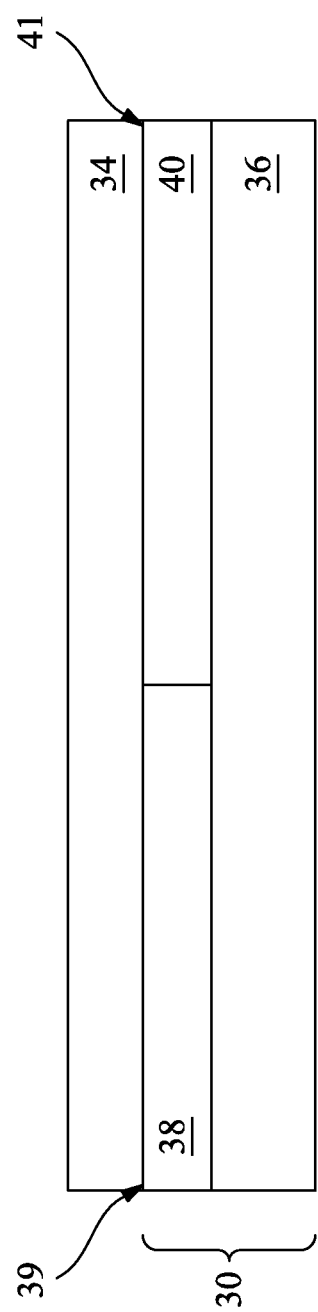
FIG. 3 is a substrate comprising, on an underlying substrate, a first layer and a second layer of different materials on which a layer is deposited in accordance with some embodiments.

FIGS. 1A through 1C illustrate cross-sectional views of intermediate stages in the manufacturing of a semiconductor structure in accordance with some embodiments, and FIG. 2 is a flow chart of the manufacturing of the semiconductor structure. In FIG. 1A and step 44 of FIG. 2, a substrate 30 is provided. The substrate 30 can be any structure on which a layer is to be deposited. Specific examples are provided in a given context below. The substrate 30 has a surface 32. The layer that is to be deposited will subsequently be deposited on the surface 32. The surface 32 can include any appropriate material, and may include a dielectric layer, a metal-containing layer, or another. The surface 32 can also include different materials within the surface 32. For example, a first portion of the surface 32 can include a dielectric material, such as a high-k dielectric like a metal oxide dielectric, and a second different portion of the surface 32 can include a metal-containing material, such as TiN, TaN, TiAl, TiAlC, or the like. In another example, the first portion of the surface can be a first metal-containing material, such as TiN, and the second different portion of the surface 32 can be a second metal-containing material, such as TaN. For clarity, FIG. 3 illustrates a substrate 30 comprising a first layer 38 and a second layer 40 of different materials on an underlying substrate 36, and a surface 32 comprising a first surface 39 of the first layer 38 and a second surface 41 of the second layer 40.

The surface 32 of the substrate 30 is terminated with a terminating species TS. In some examples, the terminating species TS is hydroxide (—OH), oxygen (—O), or the like. Termination by hydroxide (—OH) and/or oxygen (—O) can occur, for example, as a result of a cleaning or photoresist stripping process performed on the surface 32 of the substrate 30 and/or by exposing the surface 32 of the substrate 30 to a natural environment that contains oxygen. Termination by hydroxide (—OH) and/or oxygen (—O) can form an oxide layer, such as a native oxide, on the surface 32 of the substrate 30. The terminating species TS can be other species, such as hydrogen (—H), nitrogen (—N), ammonia (—NH$_3$), or the like, such as depending on a cleaning and/or stripping process that is performed on the surface 32.

In FIG. 1B and step 46 of FIG. 2, a chlorine-based treatment is performed on the surface 32 of the substrate 30. The chlorine-based treatment can remove or strip the terminating species TS from the surface 32 of the substrate 30 and a chlorine-based species, such as chlorine Cl, can re-terminate the surface 32 of the substrate 30. In some embodiments, the chlorine-based treatment includes exposing the surface 32 of the substrate 30 to a chlorine-based fluid. The chlorine-based fluid can further be a metal-chlorine fluid, such as TiCl$_x$, TaCl$_x$, WCl$_x$, the like, or a combination thereof. In some embodiments, the chlorine-based fluid, and more particularly, the metal-chlorine fluid, is a gas. The chlorine-based gas, or metal-chlorine gas, can be used in the treatment without using a plasma. In some embodiments, the surface 32 of the substrate 30 is exposed to a chlorine-based gas, in the absence of a plasma, at a temperature greater than about 200° C., a temperature less than about 600° C., and more particularly, a temperature in a range from about 200° C. to about 600° C., with a flow rate of the chlorine-based gas being in a range from about 100 sccm to about 10,000 sccm for a duration in a range from about 10 sec to about 300 sec, such as about 30 sec to about 120 sec. In a specific example, the chlorine-based treatment removes oxidation, such as a native oxide, from the surface 32 of the substrate, and terminates the surface 32 with chlorine Cl.

In FIG. 1C and step 48 of FIG. 2, a layer 34 is deposited on the surface 32 of the substrate 30 using Atomic Layer Deposition (ALD), such as at a temperature in a range from 200° C. to 500° C. In some embodiments, the layer 34 is a metal-containing layer, such as TiN, TaN, TiAl, TiAlC, or the like.

The inventors have observed a loading effect when depositing a layer across different underlying materials using ALD. This loading effect can be the result of longer incubation times on one material than on a different material on which the layer is deposited. This can further result in the deposited layer having a non-uniform thickness—the layer can have a greater thickness where the layer is deposited on one material than where the layer is deposited on another material. This can complicate deposition of such a layer in high aspect ratio openings, such as in a metal gate-last process, as illustrated below.

The inventors have discovered that using a chlorine-based treatment before depositing a layer, such as a metal-containing or metal layer, using ALD can alleviate or remove the material dependency of ALD such that the thickness of the deposited layer can be more uniform as deposited across different materials. For example, in FIG. 3, the deposition rate of layer 34 on the first layer 38 can be the same or similar to the deposition rate of layer 34 on the second layer 40, and the thickness of layer 34 on the first layer 38 can be substantially equal to the thickness of the layer 34 on the second layer 40. Deposition rates of the layer on different materials during the ALD can be more similar or the same, and hence, thicknesses of the layer as deposited on different materials can be more uniform. A slower deposition rate of a layer deposited by ALD on one of different materials can be within 50%, and more particularly within 10%, of a faster deposition rate of the layer by ALD on the other of the different materials as a result of the chlorine-based treatment and during the ALD. A lesser thicknesses of a layer deposited by ALD on one of different materials can be within 50%, and more particularly within 10%, of the larger thickness of the layer deposited by ALD on the other of the different materials as a result of the chlorine-based treatment and ALD.

Further, interface(s) between a layer deposited by ALD and underlying material(s) can be free from an oxide as a result of the chlorine-based treatment and ALD. For example, the first surface 39 may be free from an oxide between the layer 34 and the first layer 38, and the second surface 41 may be free from an oxide between the layer 34 and the second layer 40.

The following discussion illustrates an example context in which the manufacturing process discussed with respect to FIGS. 1A through 1C and 2 can be used. The manufacturing process discussed above can be used in other contexts.

Figure 4:
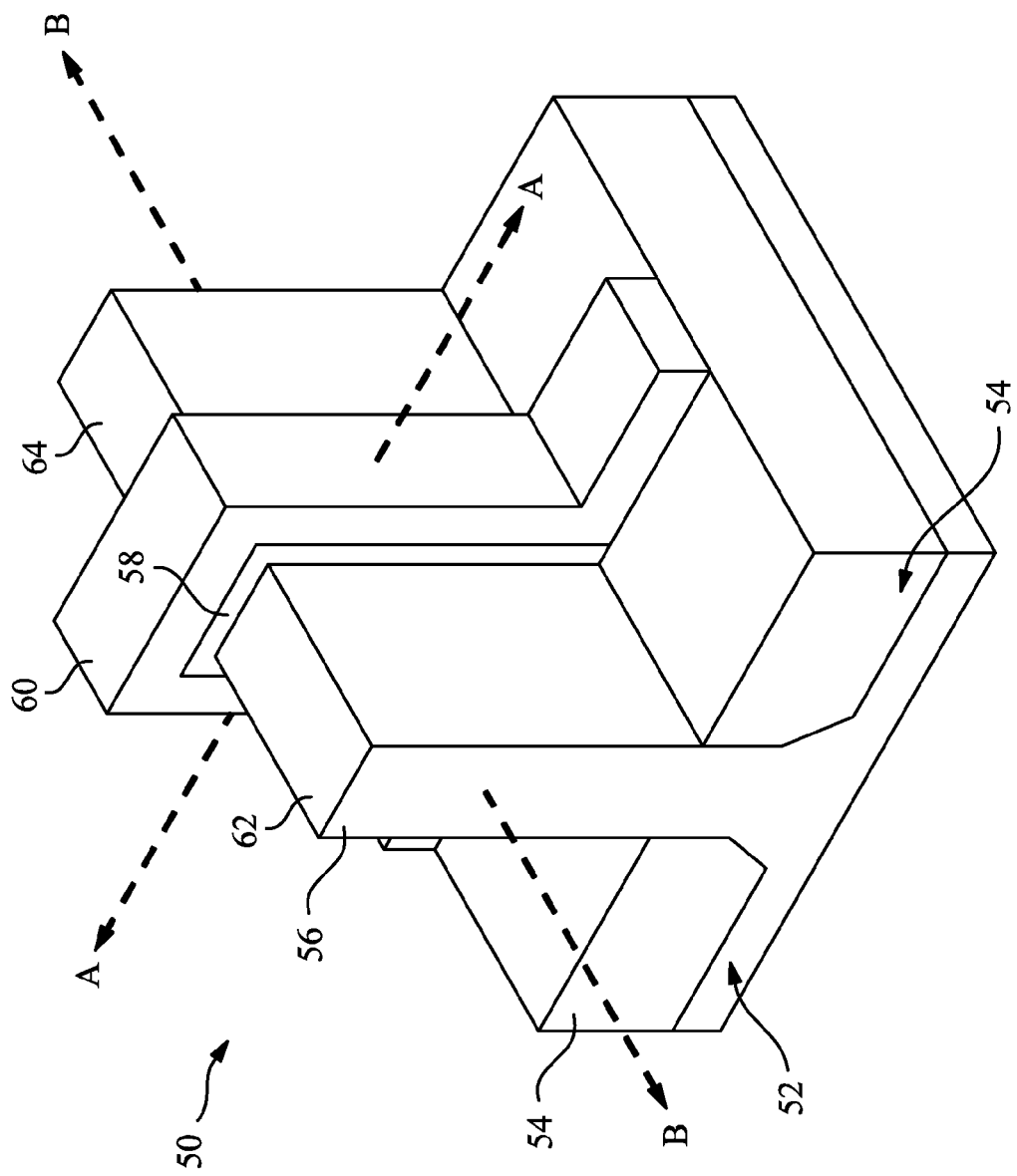
FIG. 4 is an example of a generic fin Field-Effect Transistor (finFET) in a three-dimensional view in accordance with some embodiments.

FIG. 4 illustrates an example of a generic finFET 50 in a three-dimensional view. The finFET 50 comprises a fin 56 on a substrate 52. The substrate 52 includes isolation regions 54, and the fin 56 protrudes above and from between neighboring isolation regions 54. A gate dielectric 58 is along sidewalls and over a top surface of the fin 56, and a gate electrode 60 is over the gate dielectric 58. Source/drain regions 62 and 64 are disposed in opposite sides of the fin 56 with respect to the gate dielectric 58 and gate electrode 60. FIG. 4 further illustrates reference cross-sections that are used in later figures. Cross-section A-A is across a channel, gate dielectric 58, and gate electrode 60 of the finFET 50. Cross-section B-B is perpendicular to cross-section A-A and is along a longitudinal axis of the fin 56 and in a direction of, for example, a current flow between the source/drain regions 62 and 64. Subsequent figures refer to these reference cross-sections for clarity.

Figure 5:
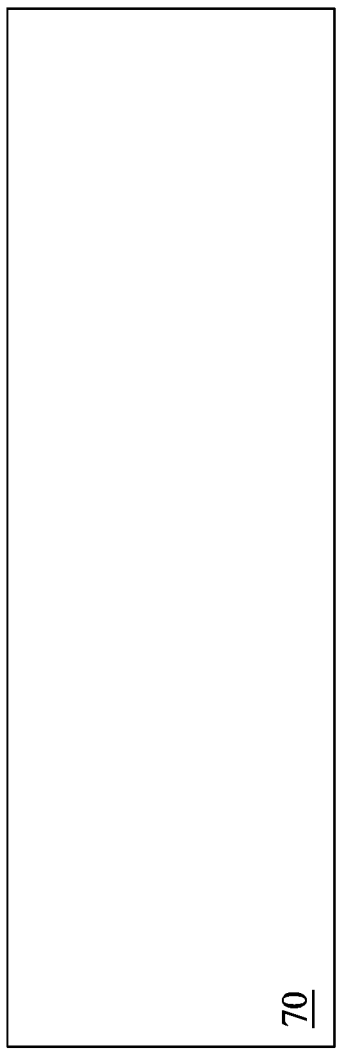
FIGS. 5, 6, 7A, 7B, and 8 through 17 are cross-sectional views of intermediate stages in the manufacturing of finFETs in accordance with some embodiments.
Figure 6:
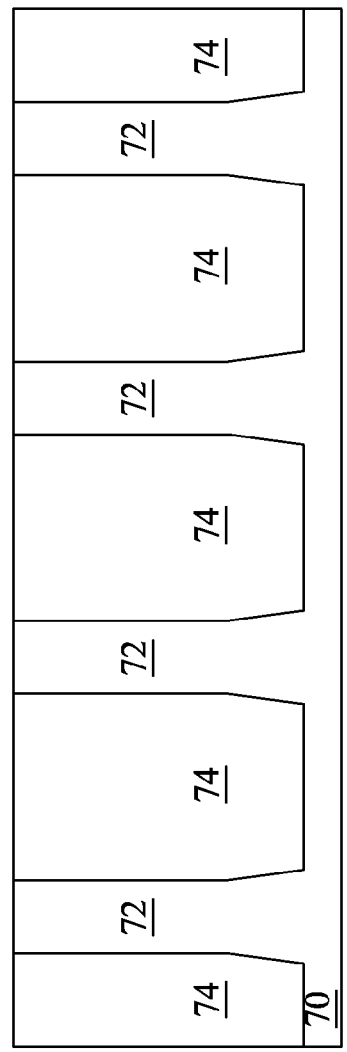
Figure 7A:
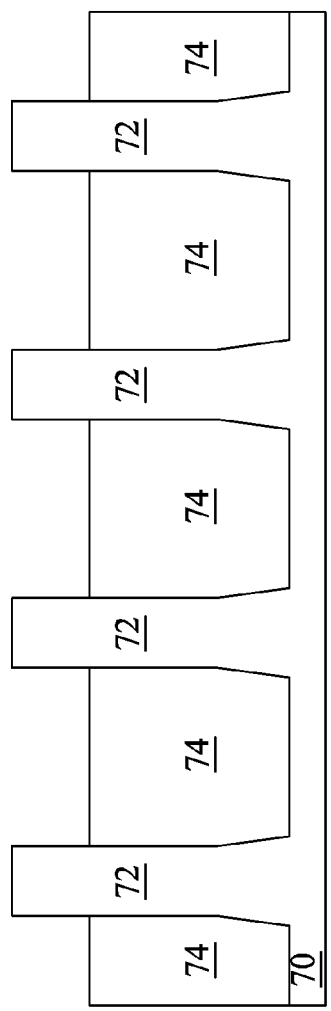

FIGS. 5 through 17 are cross-sectional views of intermediate stages in the manufacturing of finFETs in accordance with an exemplary embodiment. FIGS. 5, 6, and 7A illustrate reference cross-section A-A illustrated in FIG. 4, except for multiple fins. FIGS. 7B, 8 through 17 illustrate reference cross-section B-B illustrated in FIG. 4, except for multiple finFETs.

FIG. 5 illustrates a substrate 70. The substrate 70 may be a semiconductor substrate, such as a bulk semiconductor substrate, a semiconductor-on-insulator (SOI) substrate, a multi-layered or gradient substrate, or the like. The substrate 70 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 70 may be doped or un-doped. In a specific example, the substrate 70 is a bulk silicon substrate.

FIG. 6 illustrates the formation of fins 72 and isolation regions 74 between neighboring fins 72. In FIG. 6, fins 72 are formed in the substrate 70. In some embodiments, the fins 72 may be formed in the substrate 70 by etching trenches in the substrate 70. The etching may be any acceptable etch process, such as a reactive ion etch (RIE), neutral beam etch (NBE), the like, or a combination thereof. The etch may be anisotropic.

Further in FIG. 6, an insulation material is formed between neighboring fins 72 to form the isolation regions 74. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 6, a planarization process, such as a chemical mechanical polish (CMP), may remove any excess insulation material and form top surfaces of the isolation regions 74 and top surfaces of the fins 72 that are co-planar.

Although not specifically illustrated, appropriate wells may be formed in the fins 72 and/or substrate 70. For example, an n-well may be formed in a first region 200 and a fourth region 500 (illustrated in FIG. 7B and subsequent figures) of the substrate 70 where p-type devices, such as p-type finFETs, are to be formed, and a p-well may be formed in a second region 300 and a third region 400 of the substrate 70 (illustrated in FIG. 7B and subsequent figures) where n-type devices, such as n-type finFETs, are to be formed.

For example, to form an n-well in the first region 200 and the fourth region 500, a photoresist can formed over the fins 72 and the isolation regions 74 in the second region 300 and the third region 400 of the substrate 70. The photoresist can be patterned to expose the first region 200 and the fourth region 500 of the substrate 70. The photoresist can be formed by using a spin-on technique and can be patterned using acceptable photolithography techniques. Once the photoresist is patterned, an n-type impurity implant can be performed in the first region 200 and the fourth region 500, and the photoresist may act as a mask to substantially prevent p-type impurities from being implanted into the second region 300 and the third region 400. The n-type impurities may be phosphorus, arsenic, or the like implanted in the first region 200 and the fourth region 500 to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process.

Further, to form a p-well in the second region 300 and the third region 400, a photoresist can be formed over the fins 72 and the isolation regions 74 in the first region 200 and the fourth region 500 of the substrate. The photoresist can be patterned to expose the second region 300 and the third region 400 of the substrate 70. The photoresist can be formed by using a spin-on technique and can be patterned using acceptable photolithography techniques. Once the photoresist is patterned, a p-type impurity implant may be performed in the second region 300 and the third region 400, and the photoresist may act as a mask to substantially prevent p-type impurities from being implanted into the first region 200 and the fourth region 500. The p-type impurities may be boron, BF$_2$, or the like implanted in the second region 300 and the third region 400 to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate the p-type and n-type impurities that were implanted. The implantations may form an n-well in the first region 200 and the fourth region 400 and a p-well in the second region 300 and the third region 400.

Figure 7B:
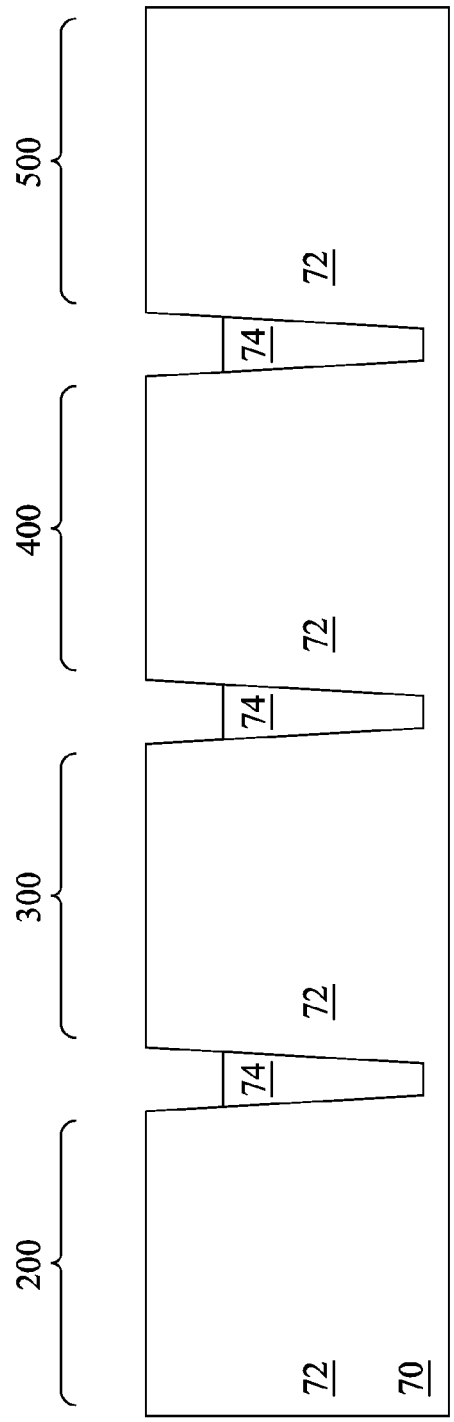

In FIGS. 7A and 7B, the isolation regions 74 are recessed, such as to form Shallow Trench Isolation (STI) regions. The isolation regions 74 are recessed such that fins 72 protrude from between neighboring isolation regions 74. The isolation regions 74 may be recessed using an acceptable etching process, such as one that is selective to the material of the isolation regions 74. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 5, 6, 7A, and 7B is just one example of how fins may be formed. In other embodiments, a dielectric layer can be formed over a top surface of the substrate 70; trenches can be etched through the dielectric layer; epitaxial fins can be epitaxially grown in the trenches; and the dielectric layer can be recessed such that the homoepitaxial and/or heteroepitaxial structures protrude from the dielectric layer to form epitaxial fins. It may be advantageous to epitaxially grow a material or epitaxial fin structure for n-type finFETs different from the material or epitaxial fin structure for p-type finFETs.

Figure 8:
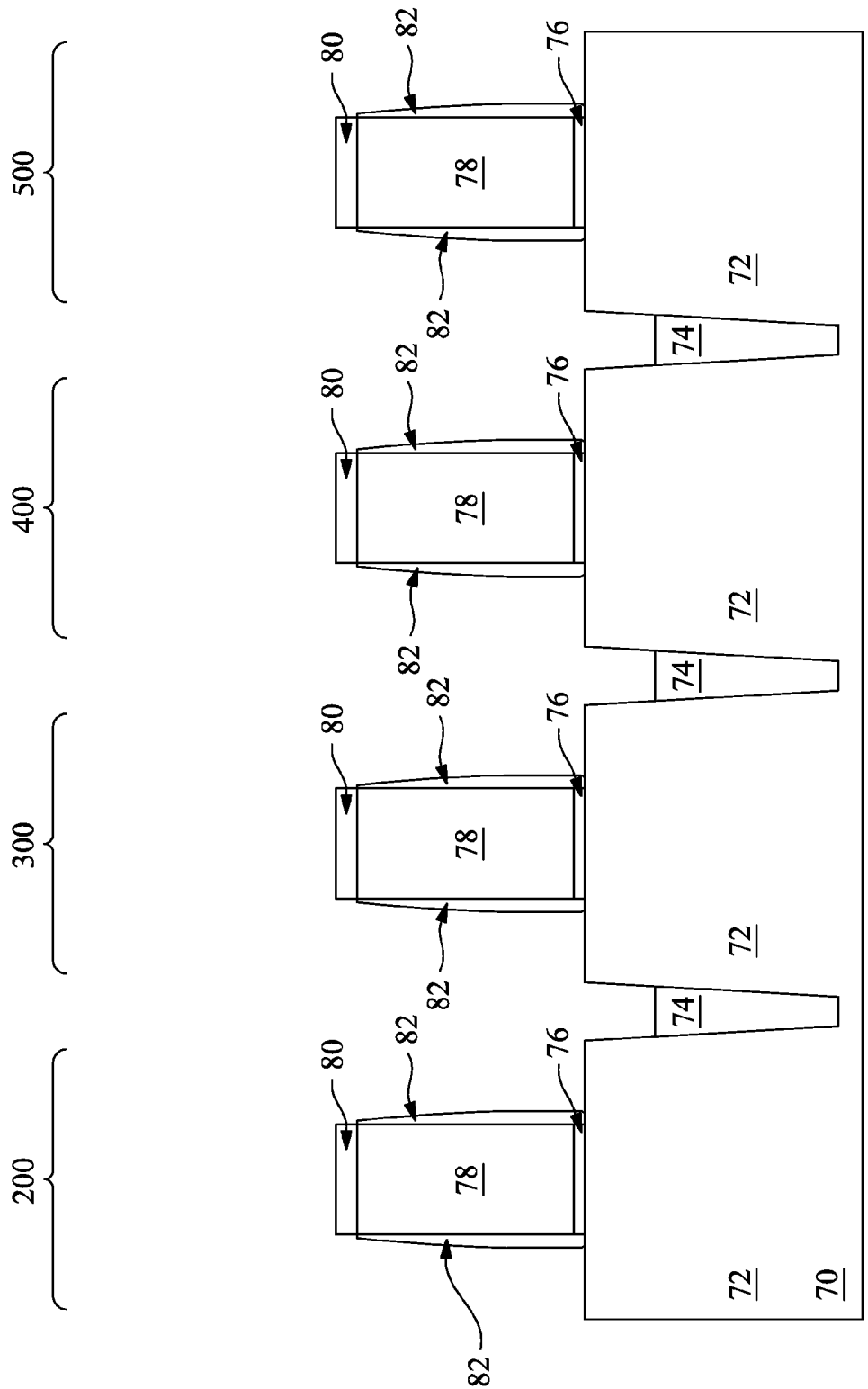

In FIG. 8, a dummy dielectric layer is formed on the fins 72. The dummy dielectric layer may be, for example, silicon oxide, silicon nitride, a combination thereof, or the like, and may be deposited or thermally grown according to acceptable techniques, such as Chemical Vapor Deposition (CVD), thermal oxidation, or the like. A dummy gate layer is formed over the dummy dielectric layer, and a mask layer is formed over the dummy gate layer. The dummy gate layer may be deposited, such as by using CVD or the like, over the dummy dielectric layer and then planarized, such as by a CMP. The mask layer may be deposited, such as by using CVD or the like, over the dummy gate layer. The dummy gate layer may comprise, for example, polysilicon, although other materials that have a high etching selectivity may also be used. The mask layer may comprise, for example, silicon nitride, silicon oxynitride, silicon carbon nitride, or the like.

Further in FIG. 8, the mask layer may be patterned using acceptable photolithography and etching techniques to form masks 80. The pattern of the masks 80 then may be transferred to the dummy gate layer and dummy dielectric layer by an acceptable etching technique to form dummy gates 78 and dummy gate dielectrics 76 from the dummy gate layer and the dummy dielectric layer, respectively. The etching may comprise an acceptable anisotropic etching, such as RIE, NBE, or the like. The dummy gates 78 cover respective channel regions of the fins 72. The dummy gates 78 may also have a lengthwise direction substantially perpendicular to the lengthwise direction of respective fins 72.

Although not specifically illustrated, implants for lightly doped source/drain (LDD) regions may be performed. Similar to the implants discussed above, a mask, such as a photoresist, may be formed over the second region 300 and the third region 400, e.g., for n-type devices, while exposing the first region 200 and the fourth region 500, e.g., for p-type devices, and p-type impurities may be implanted into the exposed fins 72 in the first region 200 and the fourth region 500. The mask may then be removed. Subsequently, a mask, such as a photoresist, may be formed over the first region 200 and the fourth region 400 while exposing the second region 300 and the third region 400, and n-type impurities may be implanted into the exposed fins 72 in the second region 300 and the third region 400. The mask may then be removed. The n-type impurities may be the any of the n-type impurities previously discussed, and the p-type impurities may be the any of the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

Further in FIG. 8, gate spacers 82 are formed along sidewalls of the dummy gates 78 and dummy gate dielectrics 76. The gate spacers 82 may be formed by conformally depositing, such as by CVD or the like, a material and subsequently anisotropically etching, such as RIE, NBE, or the like, the material. The material of the gate spacers 82 may be silicon nitride, silicon carbon nitride, a combination thereof, or the like.

Figure 9:
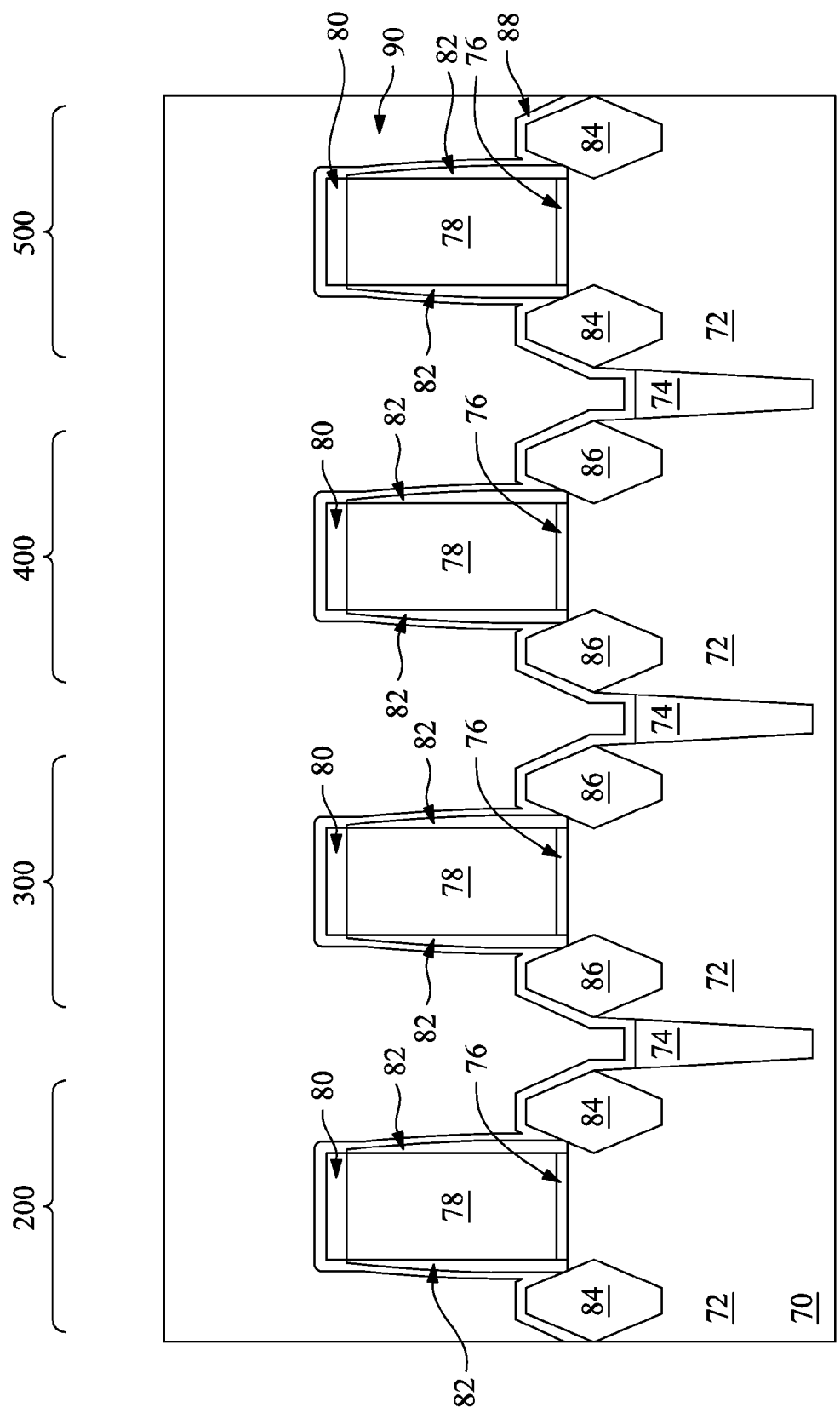

In FIG. 9, epitaxial source/drain regions 84 and 86 are formed in the source/drain region of the fins 72. In the first region 200 and the fourth region 300, epitaxial source/drain regions 84 are formed in the source/drain regions of the fins 72 such that each dummy gate 78 is disposed between ones of a respective pair of the epitaxial source/drain regions 84 in each fin 72. In the second region 300 and the third region 400, epitaxial source/drain regions 86 are formed in the source/drain regions of the fins 72 such that each dummy gate 78 is disposed between ones of a respective pair of the epitaxial source/drain regions 86 in each fin 72.

The epitaxial source/drain regions 84 in the first region 200 and the fourth region 500, e.g., for p-type devices, may be formed by masking, such as with a hard mask, the second region 300 and the third region 400, e.g., for n-type devices. Then, source/drain regions of the fins 72 in the first region 200 and the fourth region 500 are etched to form recesses. The etch may be any appropriate etch selective to the fins 72 and may be anisotropic. The epitaxial source/drain regions 84 in the first region 200 and the fourth region 500 are then epitaxially grown in the recesses. The epitaxial growth may be by using Metal-Organic CVD (MOCVD), Molecular Beam Epitaxy (MBE), Liquid Phase Epitaxy (LPE), Vapor Phase Epitaxy (VPE), the like, or a combination thereof. The epitaxial source/drain regions 84 may comprise any acceptable material, such as appropriate for p-type finFETs. For example, the epitaxial source/drain regions 84 may comprise SiGe, SiGeB, Ge, GeSn, or the like. The epitaxial source/drain regions 84 may have surfaces raised from respective outer surfaces of the fins 72 and may have facets. The mask may then be removed, such as by using an etch selective to the material of the mask.

The epitaxial source/drain regions 86 in the second region 300 and the third region 400 may be formed by masking, such as with a hard mask, the first region 200 and the fourth region 500. Then, source/drain regions of the fins 72 in the second region 300 and the third region 400 are etched to form recesses. The etch may be any appropriate etch selective to the fins 72 and may be anisotropic. The epitaxial source/drain regions 86 in the second region 300 and the third region 400 are then epitaxially grown in the recesses. The epitaxial growth may be by using MOCVD, MBE, LPE, VPE, the like, or a combination thereof. The epitaxial source/drain regions 86 may comprise any acceptable material, such as appropriate for n-type finFETs. For example, the epitaxial source/drain regions 86 may comprise silicon, SiC, SiCP, SiP, or the like. The epitaxial source/drain regions 86 may have surfaces raised from respective outer surfaces of the fins 72 and may have facets. The mask may then be removed, such as by using an etch selective to the material of the mask.

The epitaxial source/drain regions 84 and 86 and/or source/drain regions of the fins 72 may be implanted with dopants, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The p-type impurities for source/drain regions in the first region 200 and the fourth region 500, e.g., for p-type devices, may be any of the p-type impurities previously discussed, and the n-type impurities for source/drain regions in the second region 300 and the third region 400, e.g., for n-type devices, may be any of the n-type impurities previously discussed. In other embodiments, the epitaxial source/drain regions 84 and 86 may be in situ doped during growth.

Further in FIG. 9, an etch stop layer (ESL) 88 is conformally formed on epitaxial source/drain regions 84 and 86, gate spacers 82, masks 80, and isolation regions 74. In some embodiments, the ESL 88 may comprise silicon nitride, silicon carbonitride, or the like, formed using ALD, CVD, the like, or a combination thereof. A bottom inter-layer dielectric (ILD0) 90 is deposited over the ESL 88. ILD0 90 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Figure 10:
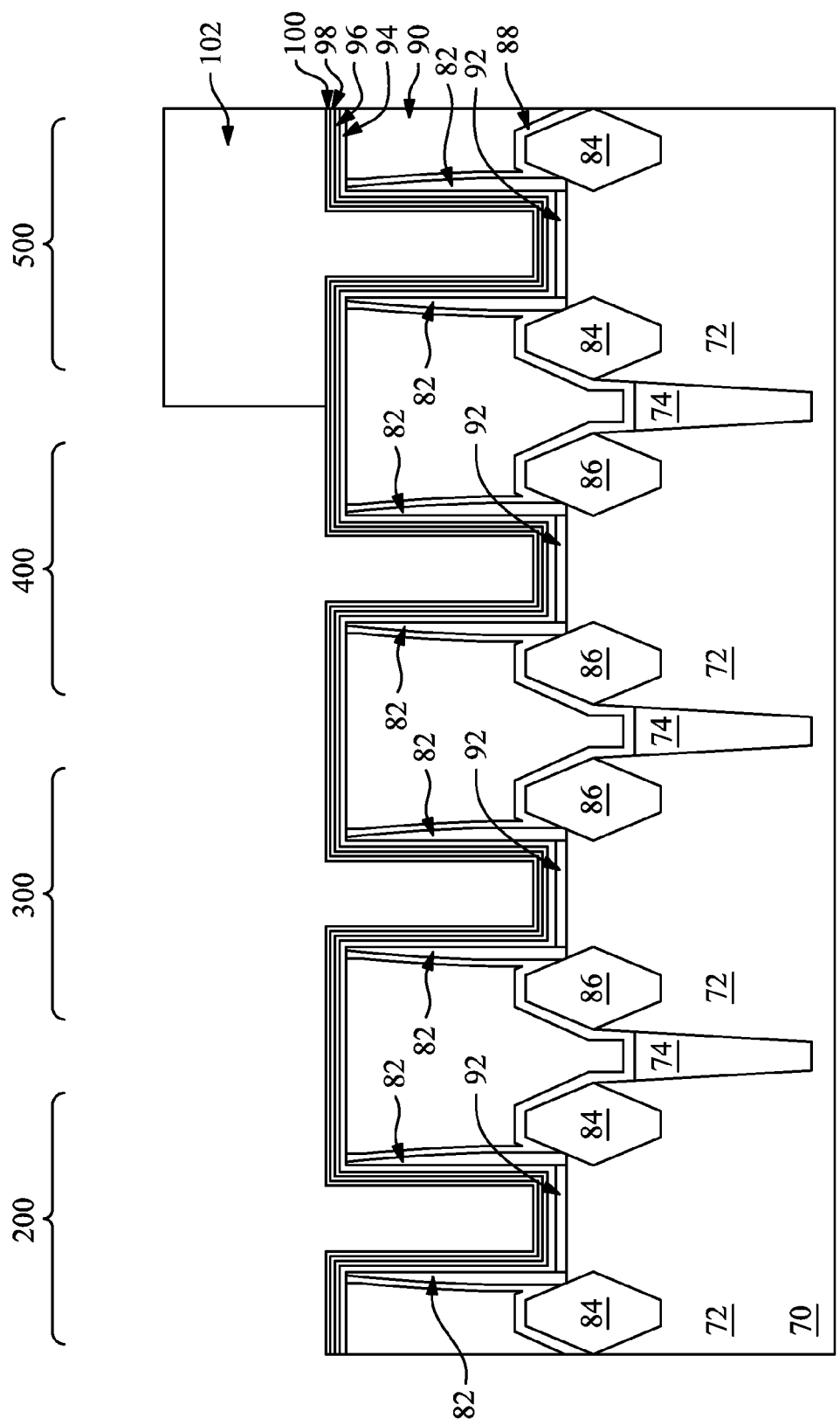

In FIG. 10, a planarization process, such as a CMP, is performed to level the top surface of ILD0 90 with the top surfaces of the dummy gates 78. The CMP may also remove the masks 80 and the ESL 88 from over the dummy gates 78. Accordingly, top surfaces of the dummy gates 78 are exposed through the ILD0 90. The dummy gates 78 and the dummy gate dielectrics 76 are removed in an etching step(s), so that openings through the ILD0 90 and defined by the gate spacers 82 are formed to the fins 72. Each opening exposes a channel region of a respective fin 72. Each channel region is disposed between neighboring pairs of epitaxial source/drain regions 84 and 86. The etching step(s) may be selective to the materials of the dummy gates 78 and the dummy gate dielectrics 76, which etching may be a dry or wet etching. During the etching, the dummy gate dielectrics 76 may be used as an etch stop layer when the dummy gates 78 are etched. The dummy gate dielectric 76 may then be etched after the removal of the dummy gates 78. Although not specifically illustrated, depending on the similarity of materials used for the ILD0 90 and the dummy gate dielectrics 76, the ILD0 90 may be recessed when the dummy gate dielectrics 76 are removed, and this recessing may cause portions of the ESL 88 and/or gate spacers 82 to protrude above the top surface of the ILD0 90.

An interfacial dielectric 92 is formed in each opening and on the fins 72. The interfacial dielectric 92 may be, for example, an oxide or the like formed by thermal oxidation, chemical oxidation, ALD, or the like. A thickness of the interfacial dielectric 92 may be in a range from about 5 Å to about 30 Å, such as about 9 Å. A gate dielectric layer 94 is then formed conformally on the top surface of the ILD0 90 and in the openings along sidewalls of the gate spacers 82 and on the interfacial dielectric 92. In some embodiments, the gate dielectric layer 94 comprises a high-k dielectric material, and in these embodiments, the gate dielectric layer 94 may have a k value greater than about 7.0, and may include a metal oxide or a silicate of Hf, Al, Zr, La, Mg, Ba, Ti, Pb, and combinations thereof. The formation methods of gate dielectric layer 94 may include ALD, CVD, Molecular-Beam Deposition (MBD), the like, or a combination thereof. A thickness of the gate dielectric layer 94 may be in a range from about 5 Å to about 30 Å, such as about 15 Å.

A capping layer is then formed conformally on the gate dielectric layer 94. In the illustrated embodiment, the capping layer comprises a first sub-layer 96 and a second sub-layer 98. In some embodiments, the capping layer may be a single layer or may comprise additional sub-layers. The capping layer may function as a barrier layer to prevent a subsequently deposited metal-containing material from diffusing into the gate dielectric layer 94. Further, the second sub-layer 98, as illustrated, can function as an etch stop during the formation of work function tuning layers in various regions 200, 300, 400 and 500 if the first sub-layer 96 is formed from a same material as the work function tuning layers, as will become clearer subsequently. The first sub-layer 96 can comprise titanium nitride (TiN) or the like deposited conformally on the gate dielectric layer 94 by ALD, CVD, or the like. The second sub-layer 98 can comprise tantalum nitride (TaN) or the like deposited conformally on the first sub-layer 96 by ALD, CVD, or the like. A thickness of the capping layer may be in a range from about 5 Å to about 60 Å, such as about 25 Å. In the illustrated embodiment, a thickness of the first sub-layer 96 may be in a range from about 5 Å to about 30 Å, such as about 10 Å, and a thickness of the second sub-layer 98 may be in a range from about 5 Å to about 30 Å, such as about 15 Å.

A first work function tuning layer 100 is then formed conformally on the capping layer, e.g., on the second sub-layer 98. The first work function tuning layer 100 may be any acceptable material to tune a work function of a device to a desired amount given the application of the device to be formed, and may be deposited using any acceptable deposition process. In some embodiments, the first work function tuning layer 100 comprises titanium nitride (TiN) or the like deposited by ALD or the like. A thickness of the first work function tuning layer 100 may be in a range from about 5 Å to about 30 Å, such as about 10 Å.

Figure 11:
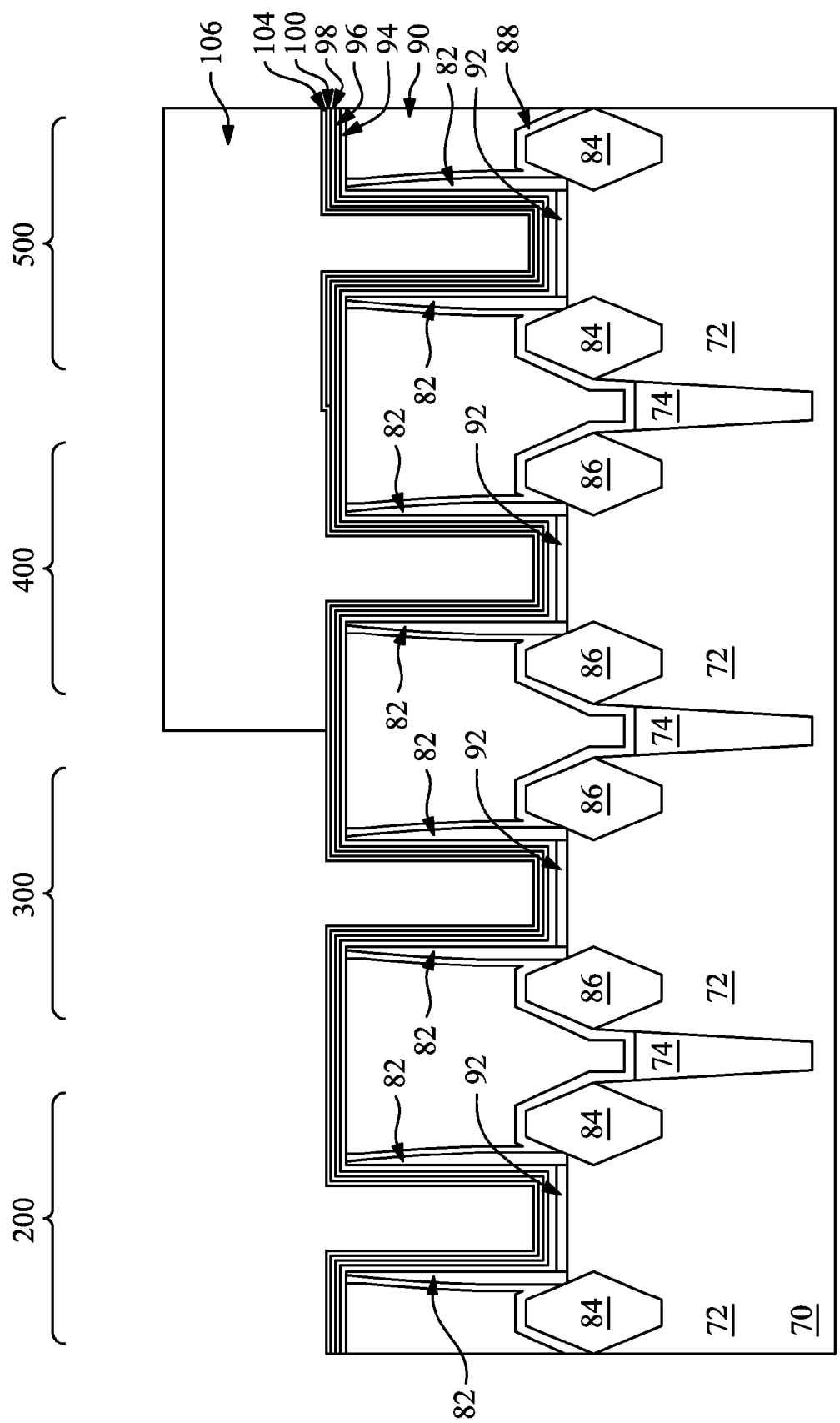

A mask 102 is then patterned over the first work function tuning layer 100 in the fourth region 500, while the first work function tuning layer 100 in the first, second, and third regions 200, 300, and 400 is exposed. In some embodiments, the mask 102 is a photoresist, which can be formed over the fourth region 500. The photoresist can be patterned to expose the first, second, and third regions 200, 300, and 400. The photoresist can be formed by using a spin-on technique and can be patterned using acceptable photolithography techniques. Once the mask 102 is patterned, an etch selective to the first work function tuning layer 100 is performed to remove the first work function tuning layer 100 from the first, second, and third regions 200, 300, and 400, as illustrated in FIG. 11. The second sub-layer 98 in the first, second, and third regions 200, 300, and 400 may act as an etch stop during this etching. The mask 102 is then removed, such as by using an appropriate ashing processing if the mask 102 is a photoresist.

A terminating species, such as hydroxide and/or oxygen, can terminate the surfaces of the second sub-layer 98 and the first work function tuning layer 100 as a result of the etching, mask 102 removal, and/or exposure to an oxygen-containing ambient, such as a natural environment. The species, such as when hydroxide and/or oxygen, can form an oxide, such as a native oxide, on these layers 98 and 100. In some embodiments, a chlorine-based treatment is performed on the surfaces of the second sub-layer 98 and the first work function tuning layer 100, as discussed with respect to FIGS. 1A through 1C and 2. The chlorine-based treatment can remove or strip the terminating species from the surfaces of the second sub-layer 98 and the first work function tuning layer 100, and a chlorine-base species, such as chlorine Cl, can re-terminate the surfaces of the second sub-layer 98 and the first work function tuning layer 100.

Then in FIG. 11, a second work function tuning layer 104 is then formed conformally on the capping layer, e.g., on the second sub-layer 98, in the first, second, and third regions 200, 300, and 400 and conformally on the first work function tuning layer 100 in the fourth region 500. The second work function tuning layer 104 may be any acceptable material to tune a work function of a device to a desired amount given the application of the device to be formed, and may be deposited using any acceptable deposition process. In some embodiments, the second work function tuning layer 104 comprises titanium nitride (TiN) or the like deposited by ALD or the like. A thickness of the second work function tuning layer 104 may be in a range from about 5 Å to about 30 Å, such as about 10 Å. In accordance with some embodiments, the deposited thickness of the second work function tuning layer 104 is more uniform over the different materials of the second sub-layer 98 in the first, second, and third regions 200, 300, and 400 and the first work function tuning layer 100 in the fourth region 500 as a result of the chlorine-based treatment.

Figure 12:
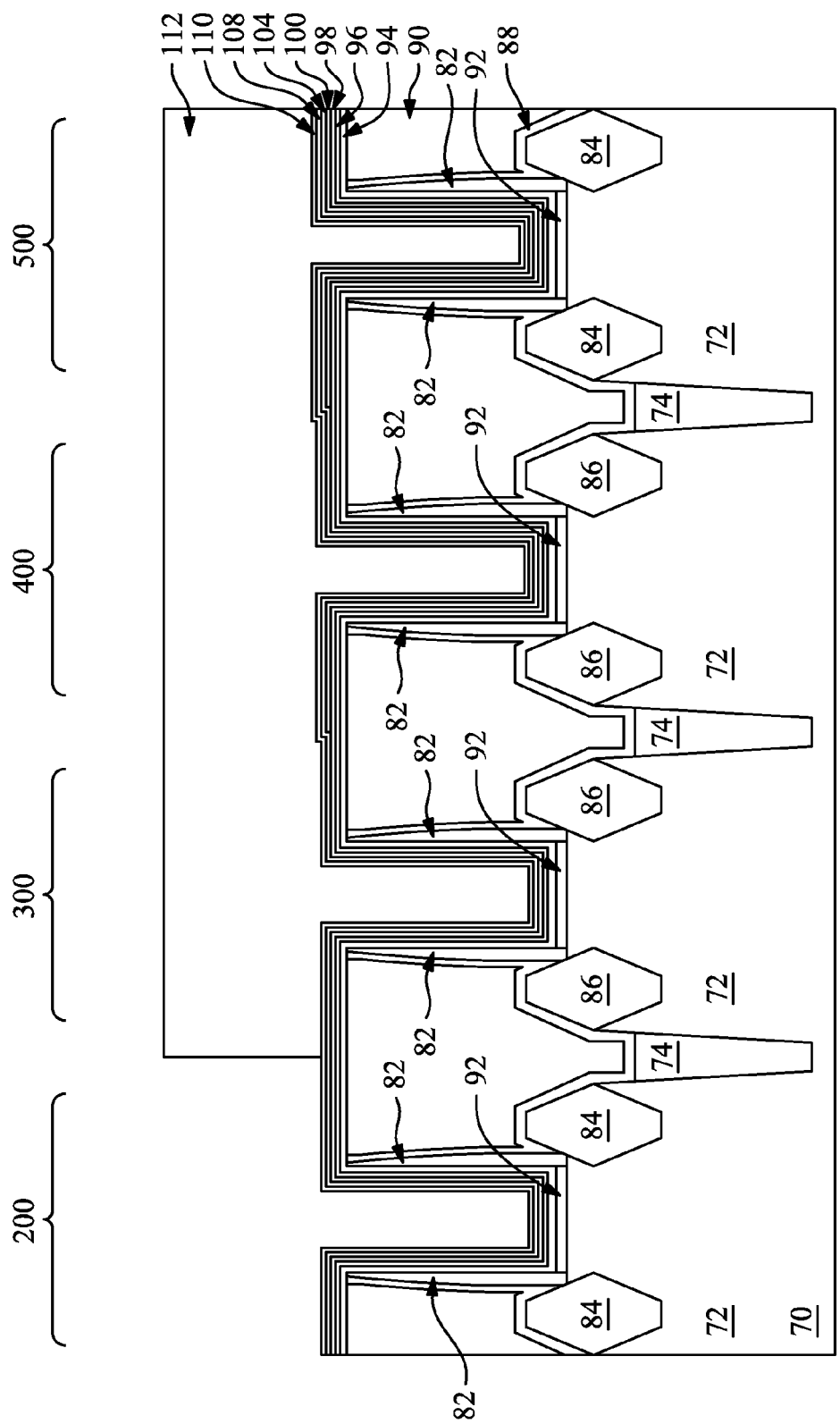

A mask 106 is then patterned over the second work function tuning layer 104 in the third and fourth regions 400 and 500, while the second work function tuning layer 104 in the first and second regions 200 and 300 is exposed. In some embodiments, the mask 106 is a photoresist, which can be formed over the third and fourth regions 400 and 500. The photoresist can be patterned to expose the first and second regions 200 and 300. The photoresist can be formed by using a spin-on technique and can be patterned using acceptable photolithography techniques. Once the mask 106 is patterned, an etch selective to the second work function tuning layer 104 is performed to remove the second work function tuning layer 104 from the first and second regions 200 and 300, as illustrated in FIG. 12. The second sub-layer 98 in the first and second regions 200 and 300 may act as an etch stop during this etching. The mask 106 is then removed, such as by using an appropriate ashing processing if the mask 106 is a photoresist.

A terminating species, such as hydroxide and/or oxygen, can terminate the surfaces of the second sub-layer 98 and the second work function tuning layer 104 as a result of the etching, mask 106 removal, and/or exposure to an oxygen-containing ambient, such as a natural environment. The species, when hydroxide and/or oxygen, can form an oxide, such as a native oxide, on these layers 98 and 104. In some embodiments, a chlorine-based treatment is performed on the surfaces of the second sub-layer 98 and the second work function tuning layer 104, as discussed with respect to FIGS. 1A through 1C and 2. The chlorine-based treatment can remove or strip the terminating species from the surfaces of the second sub-layer 98 and the second work function tuning layer 104, and a chlorine-base species, such as chlorine Cl, can re-terminate the surfaces of the second sub-layer 98 and the second work function tuning layer 104.

Then in FIG. 12, a third work function tuning layer 108 is then formed conformally on the capping layer, e.g., on the second sub-layer 98, in the first and second regions 200 and 300 and conformally on the second work function tuning layer 104 in the third and fourth regions 400 and 500, and a fourth work function tuning layer 110 is then formed conformally on the third work function tuning layer 108 in the first, second, third, and fourth regions 200, 300, 400, and 500. The third work function tuning layer 108 and fourth work function tuning layer 110 may be any acceptable material to tune a work function of a device to a desired amount given the application of the device to be formed, and may be deposited using any acceptable deposition process. In some embodiments, the third work function tuning layer 108 comprises titanium aluminum (TiAl), titanium aluminum carbon (TiAlC), or the like deposited by ALD or the like, and the fourth work function tuning layer 110 comprises titanium nitride (TiN) or the like deposited by ALD or the like. A thickness of the third work function tuning layer 108 may be in a range from about 5 Å to about 60 Å, such as about 40 Å. A thickness of the fourth work function tuning layer 110 may be in a range from about 5 Å to about 30 Å, such as about 10 Å. In accordance with some embodiments, the deposited thickness of the third work function tuning layer 108 is more uniform over the different materials of the second sub-layer 98 in the first and second regions 200 and 300 and the second work function tuning layer 104 in the third and fourth regions 400 and 500 as a result of the chlorine-based treatment.

Figure 13:
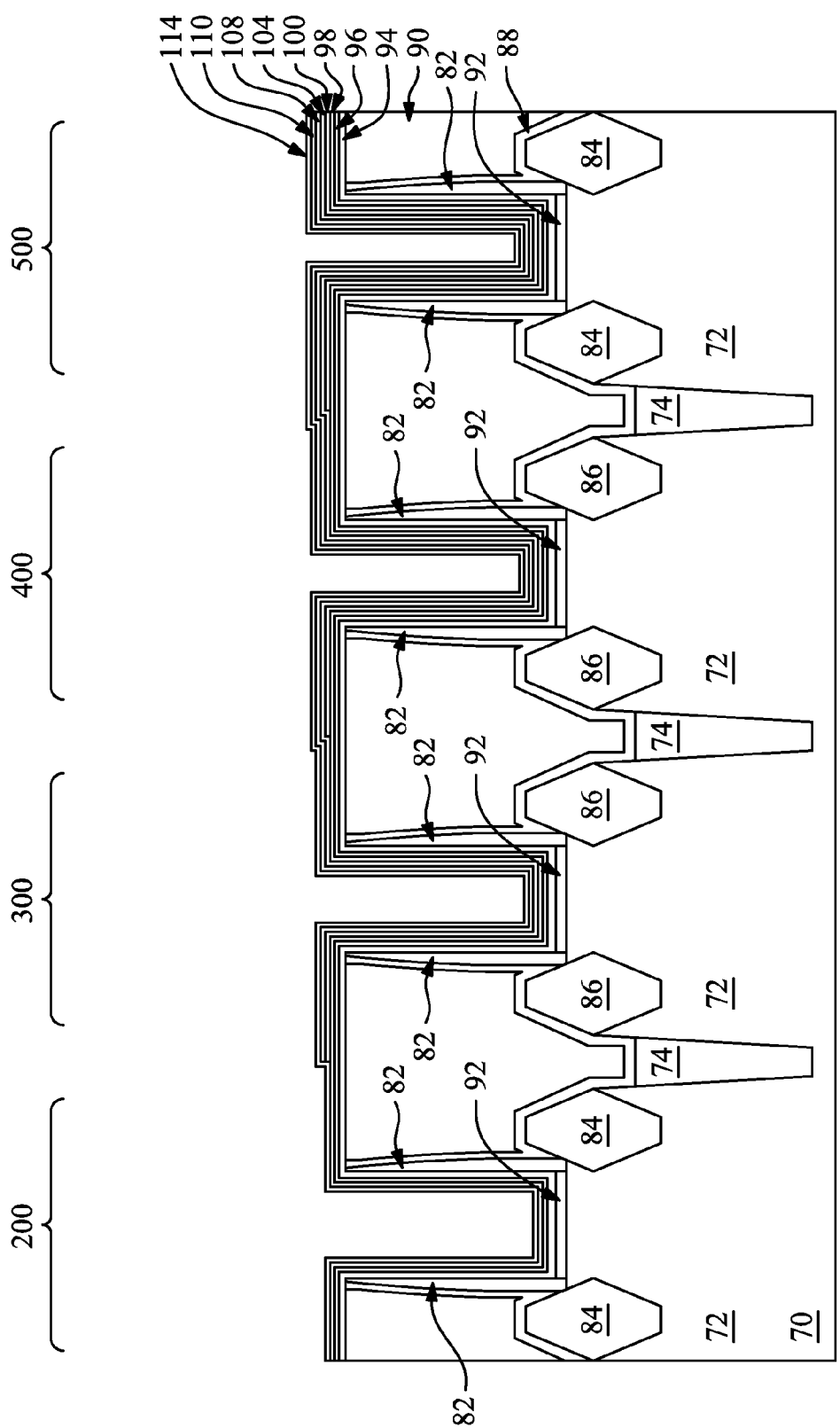

A mask 112 is then patterned over the fourth work function tuning layer 110 in the second, third, and fourth regions 300, 400, and 500, while the fourth work function tuning layer 110 in the first region 200 is exposed. In some embodiments, the mask 112 is a photoresist, which can be formed over the second, third, and fourth regions 300, 400, and 500. The photoresist can be patterned to expose the first region 200. The photoresist can be formed by using a spin-on technique and can be patterned using acceptable photolithography techniques. Once the mask 112 is patterned, an etch selective to the fourth work function tuning layer 110 and third work function tuning layer 108 is performed to remove the fourth work function tuning layer 110 and third work function tuning layer 108 from the first region 200, as illustrated in FIG. 13. The second sub-layer 98 in the first region 200 may act as an etch stop during this etching. The mask 112 is then removed, such as by using an appropriate ashing processing if the mask 112 is a photoresist.

A terminating species, such as hydroxide and/or oxygen, can terminate the surfaces of the second sub-layer 98 and the fourth work function tuning layer 110 as a result of the etching, mask 112 removal, and/or exposure to an oxygen-containing ambient, such as a natural environment. The species, when hydroxide and/or oxygen, can form an oxide, such as a native oxide, on these layers 98 and 110. In some embodiments, a chlorine-based treatment is performed on the surfaces of the second sub-layer 98 and the fourth work function tuning layer 110, as discussed with respect to FIGS. 1A through 1C and 2. The chlorine-based treatment can remove or strip the terminating species from the surfaces of the second sub-layer 98 and the fourth work function tuning layer 110, and a chlorine-base species, such as chlorine Cl, can re-terminate the surfaces of the second sub-layer 98 and the fourth work function tuning layer 110.

Then in FIG. 13, a barrier layer 114 is then formed conformally on the capping layer, e.g., on the second sub-layer 98, in the first region 200 and conformally on the fourth work function tuning layer 110 in the second, third, and fourth regions 300, 400, and 500. In some embodiments, the barrier layer 114 comprises titanium nitride (TiN) or the like deposited by ALD or the like. A thickness of the barrier layer 114 may be in a range from about 5 Å to about 50 Å, such as about 15 Å. In accordance with some embodiments, the deposited thickness of the third work function tuning layer 108 is more uniform over the different materials of the second sub-layer 98 in the first region 200 and the fourth work function tuning layer 110 in the second, third, and fourth regions 300, 400, and 500 as a result of the chlorine-based treatment.

Figure 14:
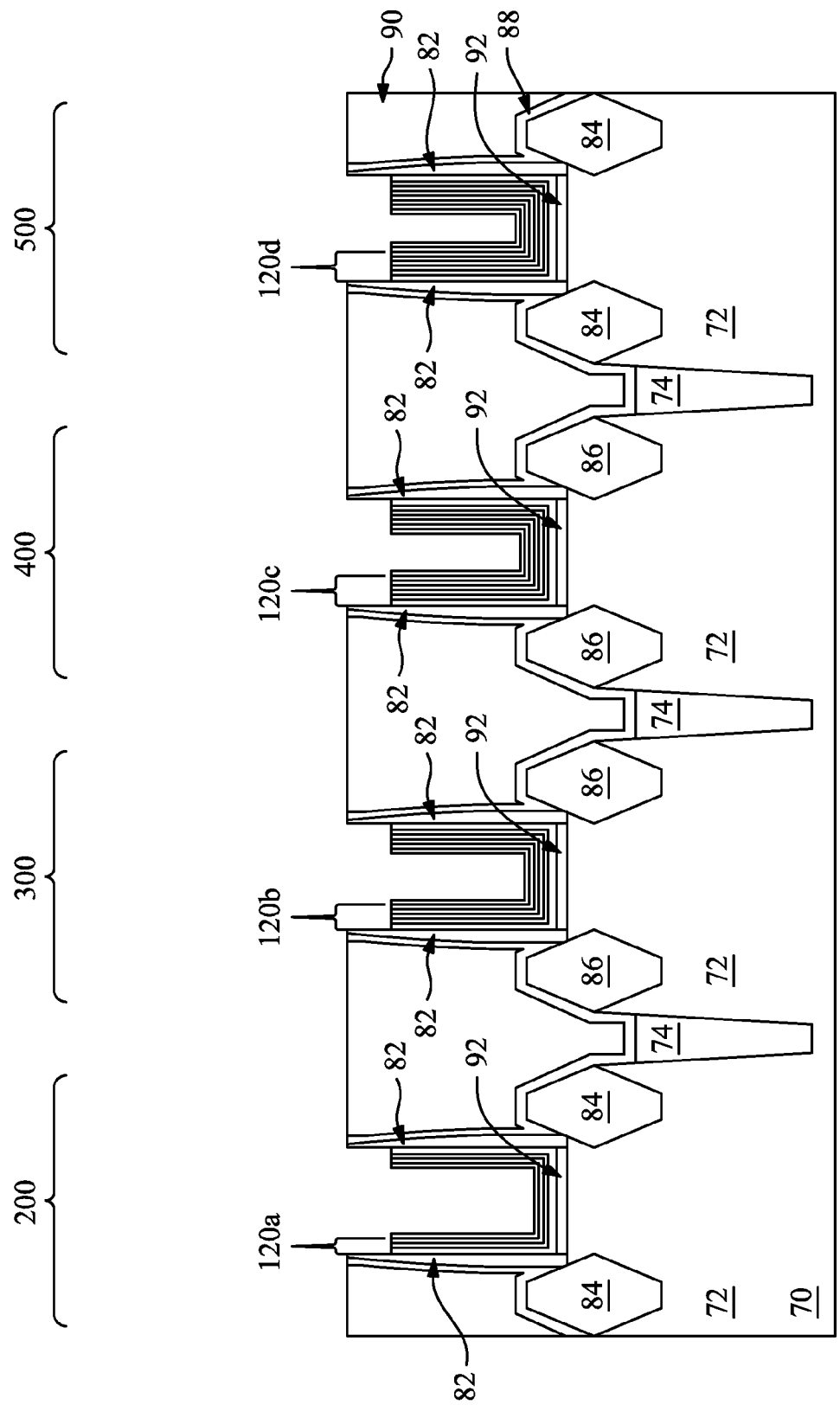

Then in FIG. 14, the gate dielectric layer 94, capping layer (including sub-layers 96 and 98), work function tuning layers 100, 104, 108, and 110, and barrier layer 114 are etched such that layered structures 120a, 120b, 120c, and 120d are formed in the first, second, third, and fourth regions 200, 300, 400, and 500, respectively. The etch can be, for example, a dry etch that substantially etches upper portions of the layers without etching lower portions of the layers in the openings. For example, the etchant gas can be selective to the materials of the layers, and process parameters can be modified to achieve the structure in FIG. 14. Aspect ratios of the openings and/or necking of the layers at the corners of the openings may factor into the etch not substantially etching bottom portions of the layers in the openings. In other embodiments, a sacrificial material can be deposited in the openings to prevent the lower portions of the layers from being etched, and the sacrificial material may be selectively removed after the etch.

As illustrated, the layered structure 120a in the first region 200 includes the gate dielectric layer 94, the capping layer (which includes the first sub-layer 96 and the second sub-layer 98), and the barrier layer 114. As illustrated, the layered structure 120b in the second region 300 includes the gate dielectric layer 94, the capping layer (which includes the first sub-layer 96 and the second sub-layer 98), the third work function tuning layer 108, the fourth work function tuning layer 110, and the barrier layer 114. As illustrated, the layered structure 120c in the third region 400 includes the gate dielectric layer 94, the capping layer (which includes the first sub-layer 96 and the second sub-layer 98), the second work function tuning layer 104, the third work function tuning layer 108, the fourth work function tuning layer 110, and the barrier layer 114. As illustrated, the layered structure 120d in the fourth region 500 includes the gate dielectric layer 94, the capping layer (which includes the first sub-layer 96 and the second sub-layer 98), the first work function tuning layer 100, the second work function tuning layer 104, the third work function tuning layer 108, the fourth work function tuning layer 110, and the barrier layer 114.

Figure 15:
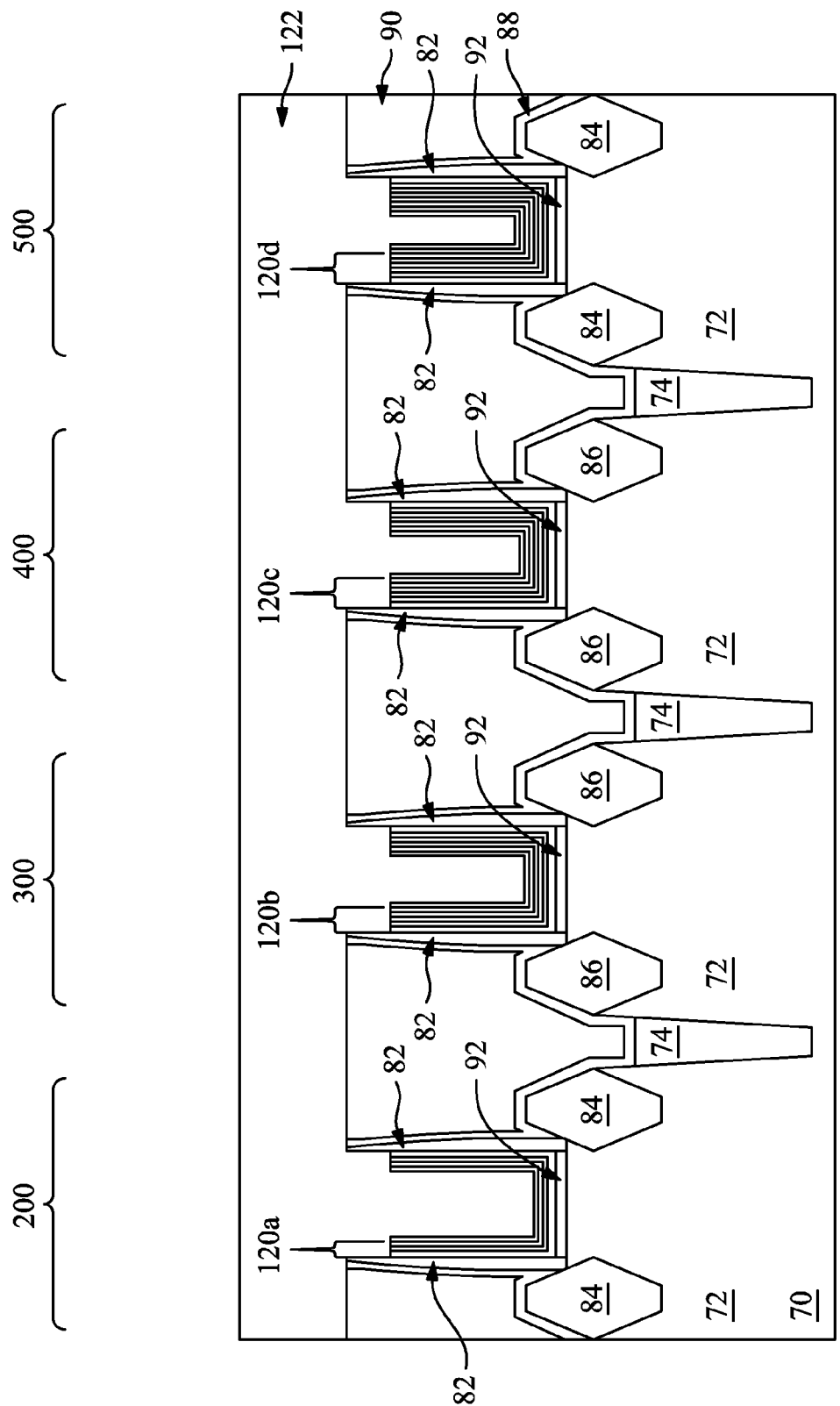
Figure 16:
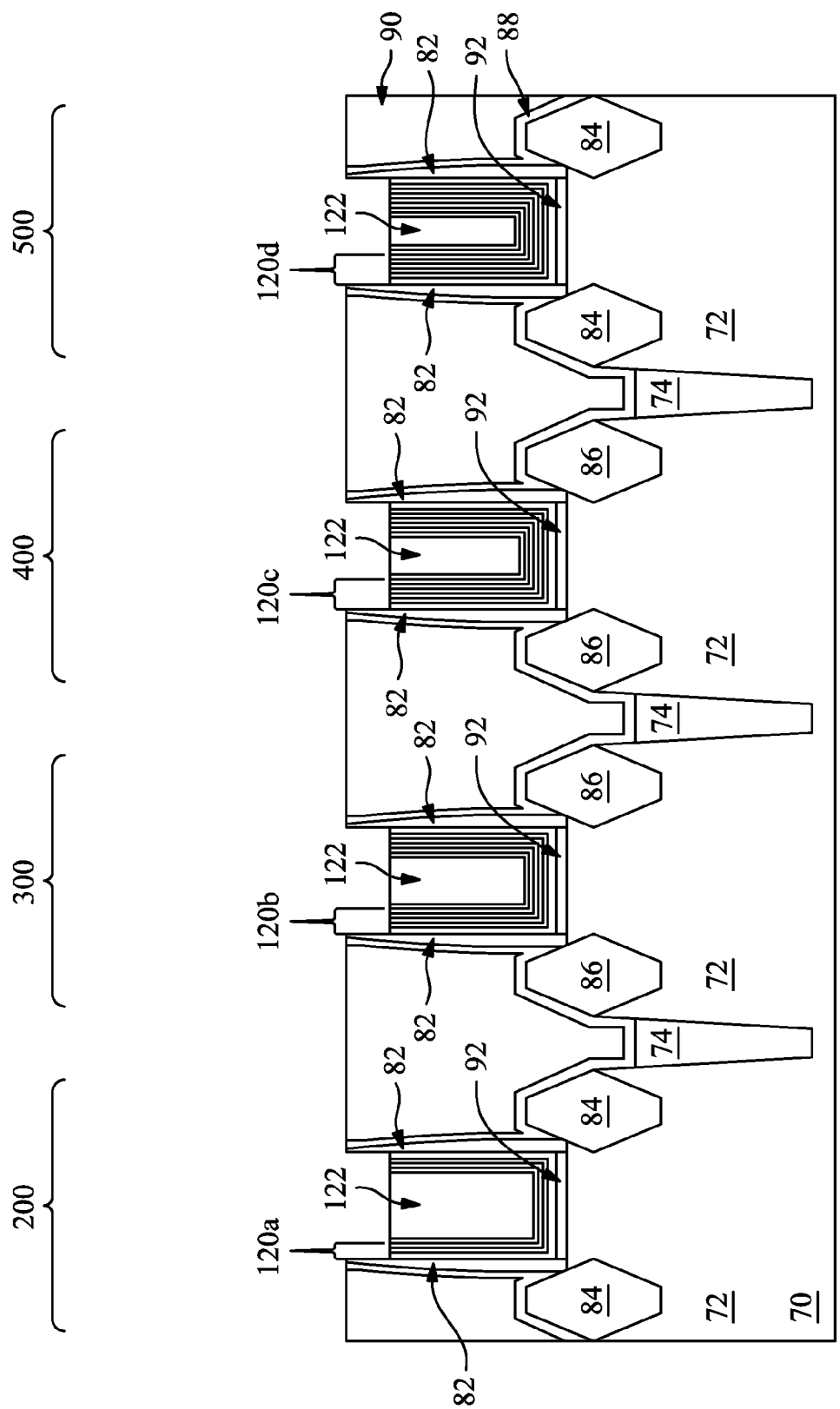

In FIG. 15, a conductive material 122 is deposited in the openings on the layered structures 120a, 120b, 120c, and 120d and on the ILD0 90. The conductive material 122 can include a metal, such as tungsten (W), aluminum (Al), cobalt (Co), ruthenium (Ru), combinations thereof or the like. The conductive material 122 can be deposited using CVD, physical vapor deposition (PVD), the like, or a combination thereof. The conductive material 122 at least fills the remaining portions, e.g., portions not filled by the layered structures 120a, 120b, 120c, and 120d, of the openings.

Next, a planarization process, such as a CMP, may be performed to remove the excess portions of conductive material 122, which excess portions are over the top surface of ILD0 90. Then, a controlled etch-back selective to the conductive material 122, and possibly selective to the layered structures 120a, 120b, 120c, and 120d, is performed to recess the conductive material 122, which results in the gate structures illustrated in FIG. 16, from the top surface of the ILD0 90.

Figure 17:
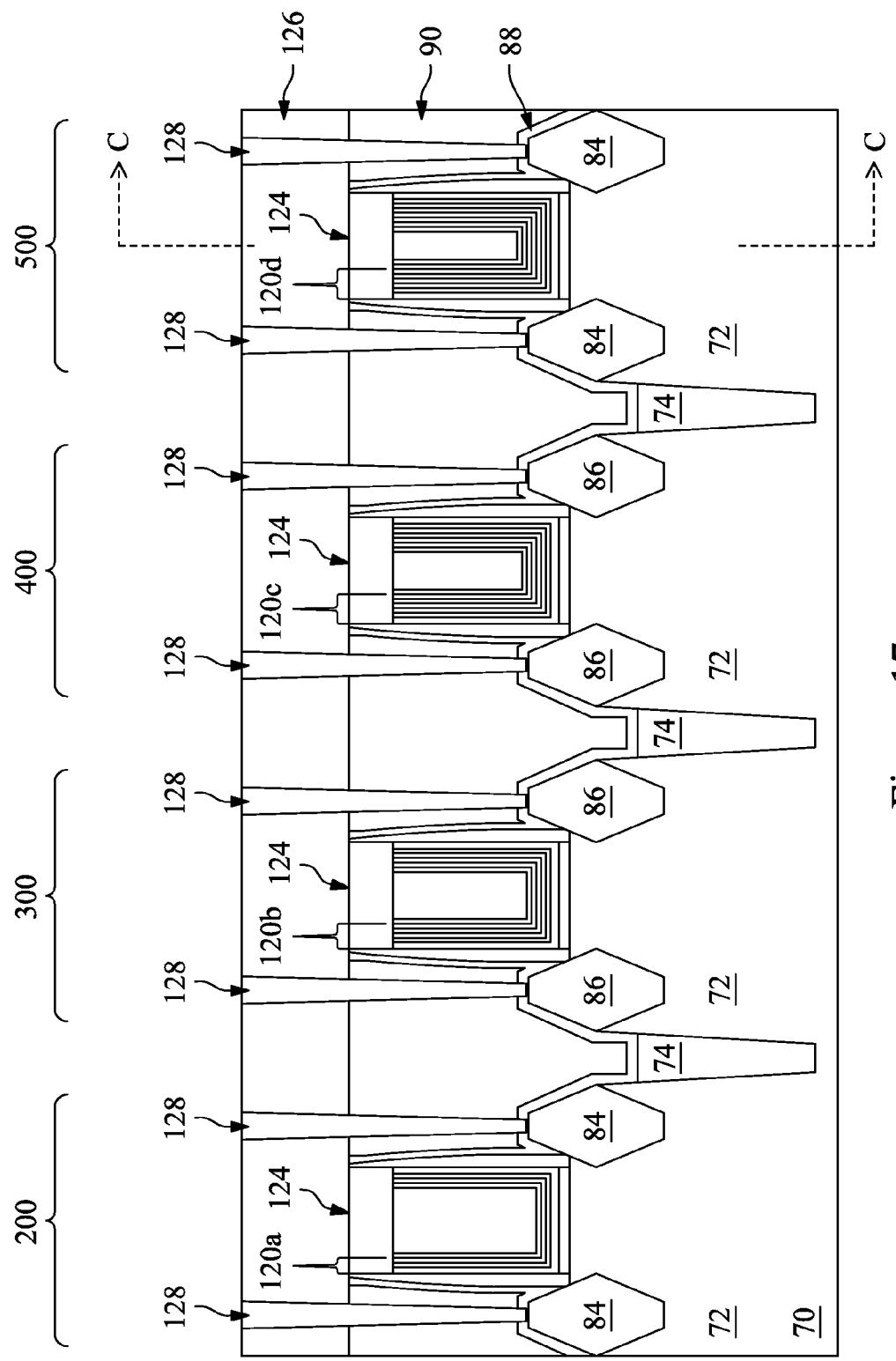

In FIG. 17, dielectric caps 124 are formed on the layered structures 120a, 120b, 120c, and 120d and conductive materials 122 in the openings. To form the dielectric caps 124, a cap dielectric layer can be deposited in the remaining portions of the openings above the layered structures 120a, 120b, 120c, and 120d and conductive materials 122 and on the top surface of the ILD0 90. The cap dielectric layer may comprise silicon nitride, silicon carbonitride, or the like, formed using CVD, PECVD, or the like. The cap dielectric layer can then be planarized, such as by CMP, to form top surfaces co-planar with the top surface of the ILD0 90 thereby forming the dielectric caps.

An upper ILD (ILD1) 126 is deposited over the ILD0 90 and the dielectric caps 124, and contacts 128 are formed through the ILD1 126, ILD0 90, and ESL 88 to the epitaxial source/drain regions 84 and 86. ILD1 126 is formed of a dielectric material such as PSG, BSG, BPSG, USG, or the like, and may be deposited by any suitable method, such as CVD and PECVD. Openings for contacts 128 are formed through the ILD1 126, ILD0 90, and ESL 88. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD1 126. The remaining liner and conductive material form contacts 128 in the openings. An anneal process may be performed to form a silicide at the interface between the epitaxial source/drain regions 84 and 86 and the contacts 128, respectively.

FIG. 17 illustrates a first device in the first region 200, which may be an ultra-low threshold voltage p-type finFET due to the layered structure 120a and conductive material 122 included in the gate structure. FIG. 17 also illustrates a second device in the second region 300, which may be an ultra-low threshold voltage n-type finFET due to the layered structure 120b and conductive material 122 included in the gate structure. FIG. 17 further illustrates a third device in the third region 400, which may be a standard threshold voltage n-type finFET due to the layered structure 120c and conductive material 122 included in the gate structure. FIG. 17 likewise illustrates a fourth device in the fourth region 500, which may be a standard threshold voltage p-type finFET due to the layered structure 120d and conductive material 122 included in the gate structure.

Although not explicitly shown, a person having ordinary skill in the art will readily understand that further processing steps may be performed on the structure in FIG. 17. For example, various Inter-Metal Dielectrics (IMD) and their corresponding metallizations may be formed over ILD1 126.

Figure 18:
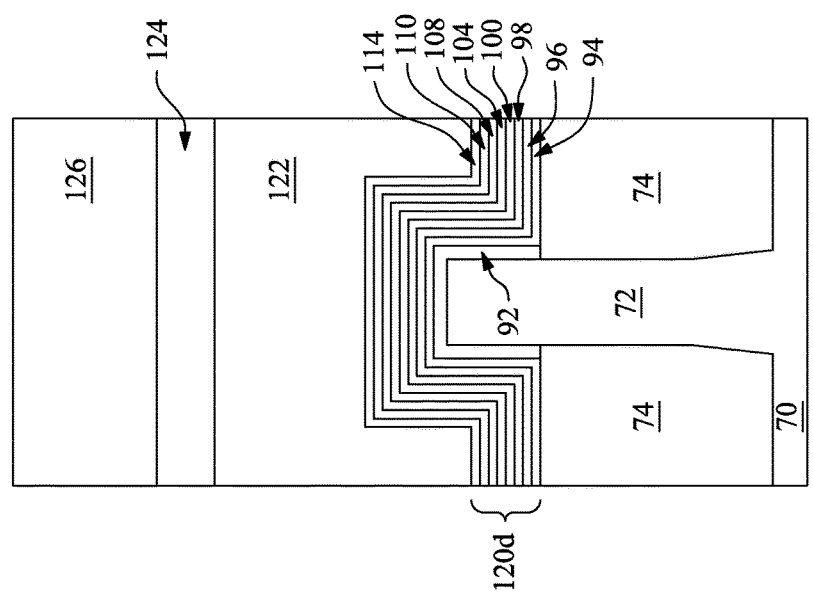
FIG. 18 is a cross sectional view of a finFET illustrated in FIG. 17 in accordance with some embodiments.

FIG. 18 illustrates cross-section C-C of FIG. 17 to illustrate aspects of the gate structure formed in the fourth region 500. The interfacial dielectric 92 and the layered structure 120d are conformal along sidewalls of the fin 72. The gate structures in the first, second, and third regions 200, 300, and 400 have similar cross sections, except with the differences in layered structures 120a, 120b, and 120c previously discussed.

Figure 19:
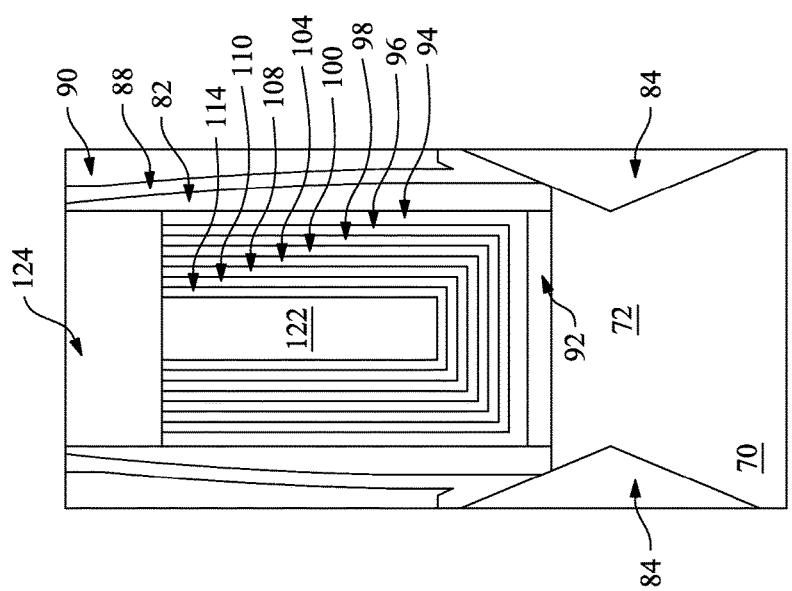
FIG. 19 is an enlarged cross sectional view of a portion of a finFET illustrated in FIG. 17 in accordance with some embodiments.

FIG. 19 is an enlarged view of a portion of the device, including the gate structure, formed in the fourth region 500, which is shown to clarify the layers formed in the gate structure. The gate structures in the first, second, and third regions 200, 300, and 400 have similar cross sections, except with the differences in layered structures 120a, 120b, and 120c previously discussed.

Additional details of some specific examples are discussed below. As a point of reference, a titanium nitride (TiN) layer is deposited by ALD on a tantalum nitride (TaN) layer without using a chlorine-based treatment. The point of reference may follow, for example, the process outlined above from the deposition of the second sub-layer 98 to the deposition of the second work function tuning layer 104 without using a chlorine-based treatment. In this point of reference, the TaN layer had a thickness of 16.49 Å, and the TiN layer had a thickness of 15.62 Å.

This point of reference was then modified to include a gaseous $WCl_5$ treatment before depositing the TiN layer by ALD. Using a 1 second treatment, the TaN layer had a thickness of 16.52 Å, and the TiN layer had a thickness of 15.21 Å. Using a 2 second treatment, the TaN layer had a thickness of 16.27 Å, and the TiN layer had a thickness of 15.36 Å. Using a 4 second treatment, the TaN layer had a thickness of 15.58 Å, and the TiN layer had a thickness of 17.01 Å. Using a 30 second treatment, the TaN layer had a thickness of 9.76 Å, and the TiN layer had a thickness of 21.43 Å. Using a 60 second treatment, the TaN layer had a thickness of 11.57 Å, and the TiN layer had a thickness of 18.57 Å. Using the treatments for 30 seconds and 60 seconds resulted in thicknesses comparable to depositing a TiN layer in situ on the TaN layer, where the TaN layer had a thickness of 9.59 Å, and the TiN layer had a thickness of 22.30 Å.

In these examples, a tantalum oxide (e.g., $Ta_2O_5$) layer was observed on the TaN layer before the $WCl_5$ treatment. The following reaction was observed:

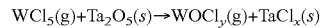
$$WCl_5(g) + Ta_2O_5(s) \rightarrow WOCl_y(g) + TaCl_x(s)$$

This reaction results in Cl passivating the TaN layer and the oxide being removed as a gaseous byproduct of the reaction. The Cl is believed to increase the reactivity on the TaN layer during the ALD process compared to when a $Ta_2O_5$ layer is present on the TaN layer. This can result in a shorter incubation cycle for the ALD process, which can result in faster deposition rates in the ALD process.

In other examples, a gaseous $TiCl_4$ treatment or a gaseous $TaCl_5$ treatment is used. Using these treatments and the gaseous $WCl_5$ treatment in different examples, it was observed that a higher treatment temperature can increase the efficiency of an oxide removal. For example, a gaseous $TaCl_5$ treatment at 525° C. had a higher oxide removal rate than a gaseous $TaCl_5$ treatment at 500° C., and the gaseous $TaCl_5$ treatment at 500° C. had a higher oxide removal rate than gaseous $TaCl_5$ treatment at 375° C. An increased temperature can decrease a barrier for desorption of the oxide byproduct of the reaction between the oxide layer on the TaN layer and the Cl-based treatment, and thus, the removal rate of the oxide layer can be increased with increased temperature.

Some embodiments can achieve advantages. As discussed, using a chlorine-based treatment on layers of different materials before using ALD to deposit another layer on those layers can increase the deposition rate of the ALD process, thereby reducing the loading effect. Further, the deposition rate can be substantially the same when using ALD to deposit a layer on differing materials, thereby reducing substrate dependence. With these advantages, gap fill problems can be overcome in processes, such as the gate-last process discussed above.

An embodiment is a method. In accordance with the method, a first metal-containing layer is formed on a substrate. A second metal-containing layer is formed on the substrate. A material of the first metal-containing layer is different from a material of the second metal-containing layer. A chlorine-based treatment is performed on the first metal-containing layer and the second metal-containing layer. A third metal-containing layer is deposited on the first metal-containing layer and the second metal-containing layer using Atomic Layer Deposition (ALD).

Another embodiment is a method. In accordance with the method, a dielectric is formed on a substrate, and the dielectric has a first opening and a second opening. A first metal-containing layer is formed on the dielectric and in the first opening and the second opening. A second metal-containing layer is formed on the first metal-containing layer. The second metal-containing layer is removed from the first opening. The first metal-containing layer in the first opening and the second metal-containing layer in the second opening are exposed to a chlorine-based fluid. A third metal-containing layer is formed on the first metal-containing layer in the first opening and the second metal-containing layer in the second opening using Atomic Layer Deposition (ALD).

A further embodiment is a method. In accordance with the method, a first metal-containing layer and a second metal-containing layer is formed, and a material of the first metal-containing layer is different from a material of the second metal-containing layer. The first metal-containing layer has a surface terminated with an oxygen-containing species. The oxygen-containing species is removed from the surface of the first metal-containing layer, and the surface of the first metal-containing layer is passivated with a chlorine-based species. A third metal-containing layer is deposited by Atomic Layer Deposition (ALD) on the surface of the first metal-containing layer passivated with the chlorine-based species and on a surface of the second metal-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first metal-containing layer on a substrate;
   forming a second metal-containing layer on the substrate, a material of the first metal-containing layer being different from a material of the second metal-containing layer;
   performing a chlorine-based treatment on the first metal-containing layer and the second metal-containing layer, wherein performing the chlorine-based treatment removes a terminating species from a surface of the first metal-containing layer and terminates the surface of the first metal-containing layer with a chlorine-based species; and
   depositing a third metal-containing layer on the first metal-containing layer and the second metal-containing layer using Atomic Layer Deposition (ALD).

2. The method of claim 1, wherein the chlorine-based treatment uses a chlorine-based gas.

3. The method of claim 1, wherein the chlorine-based treatment uses a metal-chlorine fluid.

4. The method of claim 1, wherein the chlorine-based treatment uses $TiCl_x$, $TaCl_x$, $WCl_x$, or a combination thereof.

5. The method of claim 1, wherein the chlorine-based treatment does not include using a plasma.

6. The method of claim 1, wherein the performing the chlorine-based treatment is performed at a temperature in a range from 200° C. to 600° C.

7. The method of claim 1, wherein the performing the chlorine-based treatment is performed for a duration in a range from 10 seconds to 300 seconds.

8. The method of claim 1, wherein the performing the chlorine-based treatment comprises using a chlorine-based gas at a flow rate in a range from 100 sccm to 10,000 sccm.

9. The method of claim 1, further comprising:
   forming a dielectric layer over the substrate; and
   forming an opening in the dielectric layer, wherein the first metal-containing layer is formed in the opening.

10. A method comprising:
    forming a dielectric on a substrate, the dielectric having a first opening and a second opening;
    forming a first metal-containing layer on the dielectric and in the first opening and the second opening;
    forming a second metal-containing layer on the first metal-containing layer;
    removing the second metal-containing layer from the first opening;
    exposing the first metal-containing layer in the first opening and the second metal-containing layer in the second opening to a chlorine-based fluid, wherein the exposing replaces a terminating species with a chlorine-based species; and
    forming a third metal-containing layer on the first metal-containing layer in the first opening and the second metal-containing layer in the second opening using Atomic Layer Deposition (ALD).

11. The method of claim 10, wherein an oxide layer is formed on the first metal-containing layer in the first opening after removing the second metal-containing layer from the first opening, the exposing to the chlorine-based fluid removing the oxide layer from the first metal-containing layer.

12. The method of claim 10, wherein the chlorine-based fluid is a gas.

13. The method of claim 10, wherein the chlorine-based fluid is a metal-chlorine gas.

14. The method of claim 10, wherein the exposing to the chlorine-based fluid terminates the first metal-containing layer in the first opening with a chlorine-based species.

15. The method of claim 10, wherein the first metal-containing layer is a tantalum nitride layer, the second metal-containing layer is a titanium nitride layer, and the third metal-containing layer is one of a titanium nitride layer, a titanium aluminum layer, or a titanium aluminum carbon layer.

16. A method comprising:
    forming a first metal-containing layer and a second metal-containing layer, a material of the first metal-containing layer being different from a material of the second metal-containing layer, the first metal-containing layer having a surface terminated with an oxygen-containing species;

removing the oxygen-containing species from the surface of the first metal-containing layer and passivating the surface of the first metal-containing layer with a chlorine-based species; and depositing by Atomic Layer Deposition (ALD) a third metal-containing layer on the surface of the first metal-containing layer passivated with the chlorine-based species and on a surface of the second metal-containing layer.

17. The method of claim 16, wherein the removing the oxygen-containing species and passivating with a chlorine-based species includes exposing the surface of the first metal-containing layer to a chlorine-based gas.

18. The method of claim 17, wherein the chlorine-based gas is a metal-chlorine gas.

19. The method of claim 17, wherein the chlorine-based gas is $TiCl_x$, $TaCl_x$, $WCl_x$, or a combination thereof.

20. The method of claim 16, wherein the surface terminated with the oxygen-containing species forms a native oxide.

* * * * *